(12) United States Patent
Chow

(10) Patent No.: US 8,441,808 B2
(45) Date of Patent: May 14, 2013

(54) INTERPOSER WITH MICROSPRING CONTACTS

(75) Inventor: Eugene M. Chow, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 317 days.

(21) Appl. No.: 12/887,814

(22) Filed: Sep. 22, 2010

(65) Prior Publication Data

US 2012/0067637 A1    Mar. 22, 2012

(51) Int. Cl.
*H05K 1/11* (2006.01)
*H05K 1/14* (2006.01)

(52) U.S. Cl.
USPC .............. 361/803; 361/772; 361/774; 439/66

(58) Field of Classification Search .......... 361/772–774; 439/63, 65, 631–633
See application file for complete search history.

(56) References Cited

U.S. PATENT DOCUMENTS

| | | | |
|---|---|---|---|
| 5,613,861 A | 3/1997 | Smith et al. | |
| 5,783,870 A | 7/1998 | Mostafazadeh et al. | |
| 5,848,685 A | 12/1998 | Smith et al. | |
| 5,914,218 A | 6/1999 | Smith et al. | |
| 5,944,537 A | 8/1999 | Smith et al. | |
| 5,979,892 A | 11/1999 | Smith | |
| 6,184,065 B1 | 2/2001 | Smith et al. | |
| 6,184,699 B1 | 2/2001 | Smith et al. | |
| 6,213,789 B1 | 4/2001 | Chua et al. | |
| 6,264,477 B1 | 7/2001 | Smith et al. | |
| 6,290,510 B1 | 9/2001 | Fork et al. | |
| 6,299,462 B1 | 10/2001 | Biegelsen | |
| 6,352,454 B1 | 3/2002 | Kim et al. | |
| 6,361,331 B2 | 3/2002 | Fork et al. | |
| 6,392,524 B1 | 5/2002 | Biegelsen et al. | |
| 6,396,677 B1 | 5/2002 | Chua et al. | |
| 6,439,898 B2 | 8/2002 | Chua et al. | |
| 6,504,643 B1 | 1/2003 | Peeters et al. | |
| 6,521,970 B1 * | 2/2003 | Takiar et al. | 257/522 |
| 6,528,350 B2 * | 3/2003 | Fork | 438/117 |
| 6,534,249 B2 | 3/2003 | Fork et al. | |
| 6,560,861 B2 | 5/2003 | Fork et al. | |
| 6,582,989 B2 | 6/2003 | Biegelson et al. | |
| 6,595,787 B2 | 7/2003 | Fork et al. | |
| 6,606,235 B2 | 8/2003 | Chua et al. | |
| 6,621,141 B1 | 9/2003 | Van Schuylenbergh et al. | |
| 6,632,373 B1 | 10/2003 | Rosa et al. | |
| 6,646,533 B2 | 11/2003 | Biegelson et al. | |
| 6,649,441 B2 | 11/2003 | Ruf | |
| 6,655,964 B2 | 12/2003 | Fork et al. | |
| 6,658,728 B2 | 12/2003 | Fork et al. | |
| 6,668,628 B2 | 12/2003 | Hantschel et al. | |
| 6,672,875 B1 | 1/2004 | Mathieu et al. | |
| 6,684,499 B2 | 2/2004 | Romano et al. | |
| 6,734,425 B2 | 5/2004 | Hantschel et al. | |
| 6,743,982 B2 | 6/2004 | Biegelsen et al. | |

(Continued)

*Primary Examiner* — Tuan T Dinh
(74) *Attorney, Agent, or Firm* — Jonathan A. Small

(57) ABSTRACT

An interposer including stress-engineered nonplanar microsprings may provide interconnection of bonding pads of electronic structures disposed above and below the interposer. The lateral offset between an anchor portion of a microspring disposed for contact at a bottom surface of the interposer and the tip of the microspring located in a free portion of the microspring for contact and deflection over a top surface of the interposer permits the interconnection of devices having different bonding pad pitches. Microspring contacts at the free portion permit temporary interconnection of devices, while solder applied over the free portion permit permanent connection of devices to the interposer.

6 Claims, 16 Drawing Sheets

U.S. PATENT DOCUMENTS

| | | |
|---|---|---|
| 6,777,963 B2 | 8/2004 | Rutten |
| 6,788,086 B2 | 9/2004 | Hantschel et al. |
| 6,794,725 B2 | 9/2004 | Lemmi et al. |
| 6,794,737 B2 * | 9/2004 | Romano et al. ............... 257/669 |
| 6,856,225 B1 | 2/2005 | Chua et al. |
| 6,922,327 B2 | 7/2005 | Chua et al. |
| 6,947,291 B2 | 9/2005 | Chua et al. |
| 6,998,703 B2 | 2/2006 | DiStefano et al. |
| 7,000,315 B2 | 2/2006 | Chua et al. |
| 7,015,584 B2 | 3/2006 | Chow et al. |
| 7,166,326 B1 | 1/2007 | DiStefano |
| 7,230,440 B2 | 6/2007 | Hantschel et al. |
| 7,284,324 B2 | 10/2007 | Chua et al. |
| 7,400,041 B2 * | 7/2008 | Muthukumar et al. ....... 257/750 |
| 7,426,117 B2 | 9/2008 | Van Schuylenbergh et al. |
| 2004/0022040 A1 | 2/2004 | Sitaraman et al. |
| 2004/0102064 A1 | 5/2004 | Mathieu |
| 2004/0114259 A1 | 6/2004 | Ishizuya et al. |
| 2004/0163252 A1 * | 8/2004 | Khandros et al. ............... 29/884 |
| 2004/0166702 A1 | 8/2004 | Higashi |
| 2005/0006829 A1 | 1/2005 | Chow et al. |
| 2005/0017171 A1 | 1/2005 | Samuelson et al. |
| 2005/0121758 A1 | 6/2005 | DiStefano |
| 2006/0030179 A1 * | 2/2006 | Van Schuylenbergh et al. .............................. 439/81 |
| 2006/0076693 A1 | 4/2006 | Hantschel et al. |
| 2006/0242828 A1 | 11/2006 | Kirby et al. |
| 2007/0069751 A1 | 3/2007 | Hantschel et al. |
| 2007/0141742 A1 | 6/2007 | Chua et al. |
| 2007/0158816 A1 | 7/2007 | Chow et al. |
| 2008/0095996 A1 | 4/2008 | Chua et al. |

* cited by examiner

INTERPOSER WITH MICROSPRING CONTACTS

CROSS-REFERENCE TO RELATED FILINGS

The present application is related to U.S. application for letters patent Ser. No. 12/887,775, titled "Microsprings at Least Partially Embedded in a Laminate Structure and Methods for Producing Same", with the same filing date as the present case, and which is incorporated herein by reference.

BACKGROUND

The present disclosure relates generally to a structure facilitating electrical contact between devices such as printed circuit boards and integrated circuits, referred to generally as an interposer, and more particularly to an interposer which utilizes microsprings as electrical contacts.

Electronic apparatus such as portable computers, cell phones, etc. have reduced in size from generation to generation. This reduction in size has resulted in smaller and smaller discrete devices, such as logic processors, graphics processors, etc. However, as the size of these devices decreases, so does the size and spacing (pitch) of the contact pads. This has necessitated devices which scale the small pitch of the discrete device contact pads up to a larger pitch for connection, for example to a printed circuit board (PCB). Such devices are referred to as interposers, and are well known in the art.

In addition, with this reduction in size comes a commensurate demand to pack greater numbers of discrete devices, such as memory, logic processor, graphics processor, etc. into a reduced volume. One known technique for reducing the volume into which discrete devices are packed is vertically stacking one device atop another, as opposed to laterally placing them on a printed circuit board. It is also known to use interposers to facilitate such stacking.

In one typical known embodiment, such as shown in FIG. 27, a die 150 (such as a logic processor) is connected on a first side 152 (e.g., front side) to an interposer 154. Bonding wires 156 electrically connect the contact pads of die 150 to contact pads on the first side of interposer 154. The pitch of the contact pads on interposer 154 is larger than that of die 150. Through-vias 158 in interposer 154 then deliver the electrical connection from the contact pads on first surface 152 to for example solder balls 160 second side (e.g., back-side) 162 of interposer 154 at the larger pitch of the contact pads on interposer 154. The structure may optionally be encapsulated in an appropriate insulative material 162 to protect the bond wires and electrical components. Solder balls 160 may then make connection, at a more appropriate or desired pitch, to a PCB, socket, etc. See, e.g., U.S. Pat. No. 5,783,870 entitled "Method of Connecting Packages of a Stacked Ball Array Structure", which is incorporated herein by reference.

There are a number of drawbacks or challenges when using known interposers. First, interposers of the type described above require forming through-vias and filling those vias with conductive material. For silicon substrates, this etching typically done by a high-density plasma etch. This is a costly process, primarily due to the desired high density of filled vias. Other substrates may be employed in lower cost processes, although results are generally below the desired density. Low-density silicon feed troughs are available with wet etching. Glass-based interposers can be produced using bead blasting and conductive paste, but again at low density, and not on the desired silicon substrate. In general, there is a tradeoff between cost and desired density, as well as limits on the types of materials that may be used as a substrate for the interposer.

In addition, typical interposers are not flexible or compliant, in that they cannot accommodate relative movement between the stacked devices. This leads to stress-based failure of the electrical interconnections or structural integrity of the stacked structures. Furthermore, ball grid array (BGA) interconnections are relatively inflexible to out-of-plane connections. In the event that one or more of the solder balls are mis-sized or mis-placed, or a device is out of plane, they may either be incapable of making electrical interconnection or prevent other solder balls from making electrical interconnection between the interposer and the PCB, socket, etc.

Still further, optically transparent interposers with electrical feedthoughs are only available in low density, due in part to the limit on materials available for the interposer substrate and the methods of their fabrication.

Finally, once electrical connection to an interposer is made, typically by soldering or BGA, it is generally not reworkable. If the connection is inadequate, the interposer and die cannot be separated and reconnected. Rather, the two components are typically disposed of or recycled.

Therefore, there is a need in the art for an improved interposer that, inter alia, avoids costly via etching and filling, provides reliable, compliant connection between stacked devices, provides a high density of connections, and the option of an optically transparent substrate.

SUMMARY

Accordingly, the present disclosure is directed to improved interposer designs, systems in which said interposers are disposed, and methods for making such improved interposers. Costly via etching and filling is avoided. Reliable, compliant connection between stacked devices with a high interconnection density, optionally on an optically transparent substrate, is provided.

According to one aspect of the disclosure an interposer is based on a stress-engineered metals system having a laminated layer applied thereover. Stress-engineered metals systems, such as disclosed and described in U.S. Pat. No. 5,914,218, which is incorporated by reference, are utilized to produce photolithographically patterned spring devices (referred to herein as "microsprings"). The resulting microspring is generally a micrometer-scale elongated metal structure having a free portion that bends upward from an anchor portion that is affixed directly or indirectly to a substrate.

The process of forming stress-engineered microsprings facilitates the formation of arrays of devices with contact points (distal ends) out of the plane in which the devices are initially formed, and may form the contacts at one side of the interposer. Exposed anchors (proximal ends) or through-vias may connect the microspring at one side of the interposer to contact pads on a second, opposite side of the interposer. Alternatively, multi-layer rerouting may be employed during fabrication of the interposer to make the connection between the microspring on the first side of the interposer to the contact pad on the second side of the interposer.

A laminate structure may then be placed or formed over the microspring. The laminate structure may prevent electrical shorting of the microspring to other components within the device stack, provide mechanical protection to the microsprings, act as a spring spacer layer, increase the strength of the anchor between spring and substrate, provide a gap stop during spring deflection, and protect embedded elements from moisture and contamination. The laminate structure may be pre-formed and the microspring tips pierce through it as it is placed over the microspring structure, or the laminate structure may be formed and hardened or cured over the microspring structure.

The laminate structure may be a homogeneous body, or may be formed of two or more layers. In the case that the laminate structure is formed of multiple layers, or one or more of the layers may be removed, such as after handling and/or processing of the structure, to thereby expose at least the tip of the microspring for contact.

The laminate structure may form a mask, enabling the selective plating or deposition of material such as solder over the microspring tip region. Alternatively, the laminate structure may form a mask for etching, cleaning, or other processing of the tip portion of the microspring.

Therefore, according to one aspect of the present disclosure, an interposer structure is provided that comprises a dielectric body having a first surface and a second surface, each said surface being roughly parallel and on opposite sides of said dielectric body; a microspring comprising an anchor portion and a free portion in physical and electrical communication with one another; said free portion having a nonplanar profile, in the absence of an external force applied thereto, said free portion being free to move relative to said first surface of said dielectric body; said anchor portion being fixed to said dielectric body and disposed for electrical connection thereto at said second surface; and at least a portion of said microspring between said anchor portion and said free portion being disposed within said dielectric body.

Thus, the present disclosure provides an interposer providing a far simpler and more reliable method of interconnection, as well as a far simpler method for the manufacture of such an interposer. No wire bonds are required. No deep substrate etching or filling is required. High-density interposer connections are possible from optically transparent substrates. Very thin and flexible interposers may also be provided. Still further, re-working of connections between device and interposer are possible, and enable integrated system testing before final system assembly.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present invention. Thus, where details are otherwise well known, we leave it to the application of the present invention to suggest or dictate choices relating to those details.

Figure 1:
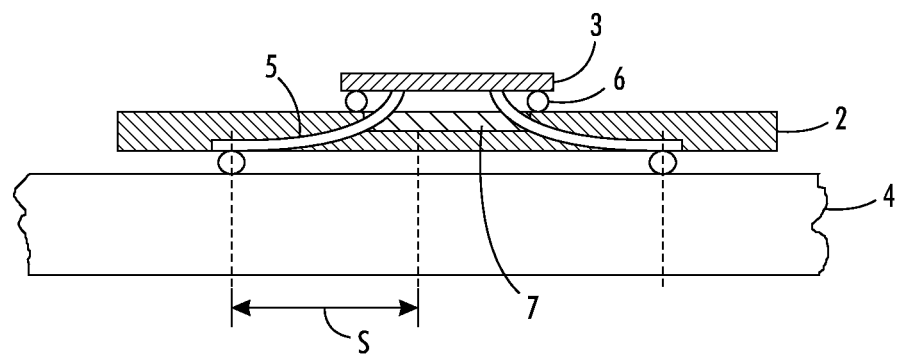
FIG. 1 is a side view of a single-layer interposer with a first electronic structure (shown below the interposer) and a second electronic structure (shown above the interposer) electronically interconnected by microsprings according to one embodiment of the present disclosure.

With reference initially to FIG. 1, there is shown therein a cross-sectional view of an interposed 2 disposed between integrated circuit (IC) 3 and printed circuit board (PCB) 4, according to an embodiment of the present disclosure. The role of interposer 2 is to electrically connect contact pads on IC 3, to contact pads on PCB 4. The connection is made by one or more microsprings 5 that extend through interposer 2, as described further below.

The point of contact between microspring 5 and a contact pad of IC 3 is typically a pressure contact between the tip of microspring 5 and the contact pad, and may or may not be a more permanent connection such as a solder joint. For this reason, the electrical interconnection between interposer 2 and IC 3 can be temporary, such as for device test, or permanent, such as if IC 3 passes device test and a final device is being assembled. Also, IC 3 may be spaced apart from interposer 2, for example by way of a spacer 6, or may be in contact with interposer 2, with the tip of microspring 5 allowed to compress into recess 7.

Solder or similar conductive attachment means may, however, connect contact pads (formed, for example from a portion of a microspring 5, through a filled via, by way of an exposed portion of a layered re-routing contact, etc.) at the back side of interposer 2 and contact pads at the surface of PCB 4.

Figure 2:
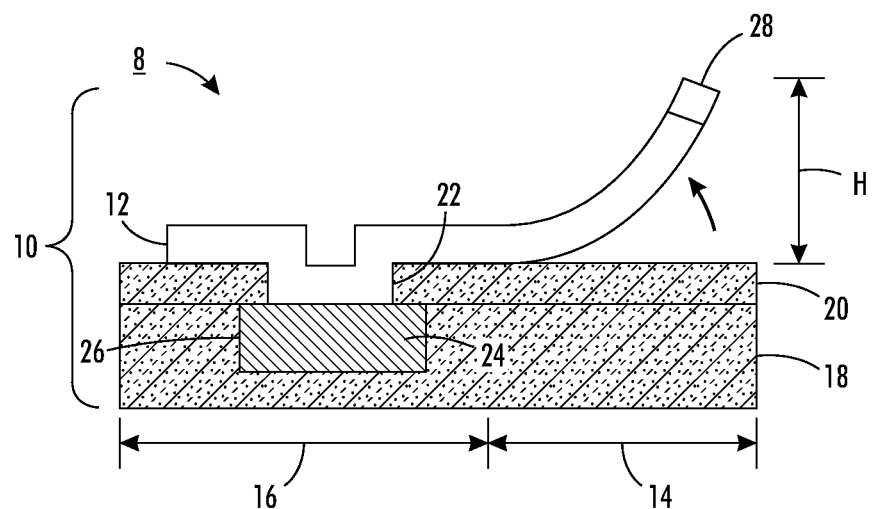
FIG. 2 is a side view of a microspring structure comprising a microspring formed over a dielectric layer carried by a substrate of a type that may form an embodiment of the present disclosure.

FIG. 2 illustrates in side view a portion of one embodiment of an interposer 8, comprised in part of a microspring structure 10 providing top- and bottom surface contact. There are a number of different microspring structures that may be employed to produce an interposer as disclosed herein. The choice of microspring design, materials, physical properties, etc. will be determined by many factors, and does not limit the generality of a microspring-based interposer design disclosed herein. Multiple layers of stacked microsprings may also be formed, such as disclosed in the aforementioned U.S. Pat. No. 7,550,855. Importantly, however, there must be an electrical connection between a tip portion of a microspring at or above the top surface of interposer 8, as well as at the bottom surface of interposer 8. While interposer 8 will typically include a plurality of microsprings, only one such microspring 12 is shown for ease of explanation.

Microspring 12 comprises a free portion 14 and an anchor portion 16 fixed to substrate 18 (e.g., glass, silicon, quartz, etc.). Prior to formation of microspring 12, a dielectric layer 20 may be formed over the surface of substrate 18, and an opening 22 formed therein. Microspring 12 is formed such that it is electrically connected to a contact 24, formed for example in a via 26 in substrate 18, such as through opening 22. The connection between microspring 12 and contact 24 may provide both electrical intercommunication therebetween as well as physical connection further securing microspring 12 to substrate 18. Furthermore, microspring 12 may be connected to substrate 18 only at contact 24. In still other embodiments, microspring 12 is formed over and affixed to a separate anchor (not shown) which itself is attached to substrate 18, with or without a separate electrical contact.

Microspring 12 may be made of an elastically deformable material, such as a molybdenum-chrome (MoCr) alloy, a nickel-zirconium (NiZr) alloy, or any of a variety of metals or alloys suitable for the creation of microsprings, such as Mo, MoCr, W, Ni, NiZr, Cu, diamond, or other alloys, non-metals, oxides, nitrides or organic materials. Preferably, the material from which microspring 12 is formed is electrically conductive, although it may be formed of a non-conductive or semi-conductive material. If formed of a non-conductive or semi-conductive material, microspring 12 may be coated or plated with an electrically conductive material, not shown, so as to provide an electrically conductive contact.

As well understood, microspring 12 is initially formed from a stress-engineered metals system in a plane that is roughly parallel to the plane of the surface of substrate 18. Formation is typically by photolithographic techniques well known in the art. The stress-engineered metal film (i.e., a metal film fabricated to have a stress differential such that its lower portions have a higher internal compressive stress than its upper portions) is typically patterned by photolithography to form microspring 12. According to one technique, different materials are deposited in layers, each having a desired stress characteristic, for example a tensile layer formed over a compressive layer. According to another technique a single layer is provided with an intrinsic stress differential by altering the fabrication parameters as the layer is deposited.

One of a variety of techniques, such as etch undercutting, is employed to release the free portion 14 of microspring 12, including tip 28, and the internal stress within microspring 12 causes tip 28 to pull up out of plane, creating for example a concave microspring as shown in FIG. 1 (many different resulting microspring profiles are know and may be employed in the interposer disclosed herein.

In a typical embodiment, tip 28 rises to a height, H, above the surface of layer 20 on the order of 10-250 μm. The width of microspring 12 is typically in the range of 5-100 μm. Tip 28 may be pointed, rounded, flat or other shape, as will be understood by one skilled in the art.

Figure 3:
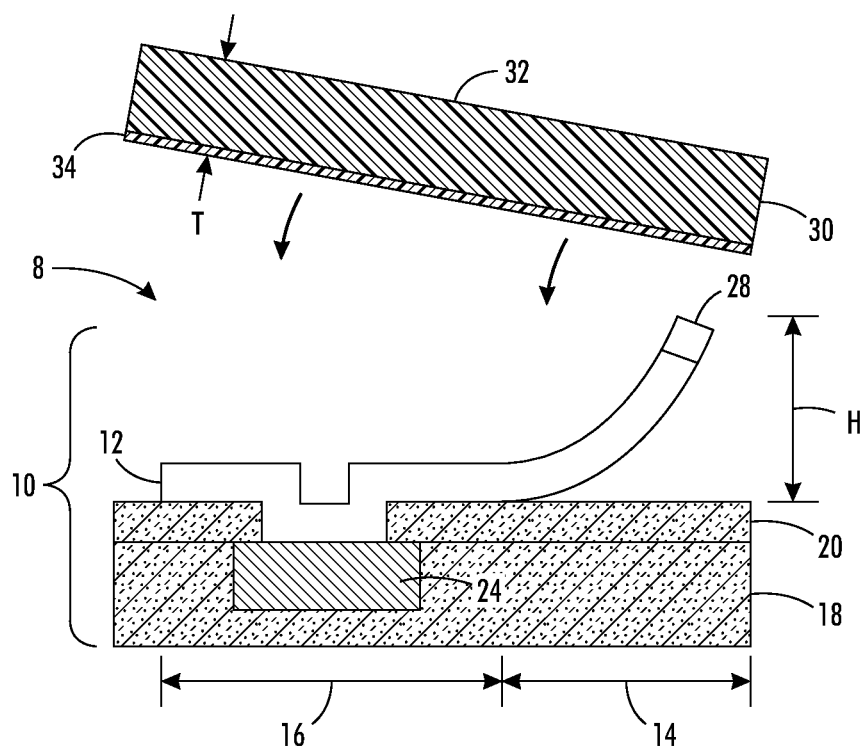
FIG. 3 is a side view of a microspring structure with a thin laminate structure in the process of being applied thereover according to one embodiment of the present disclosure.
Figure 4:
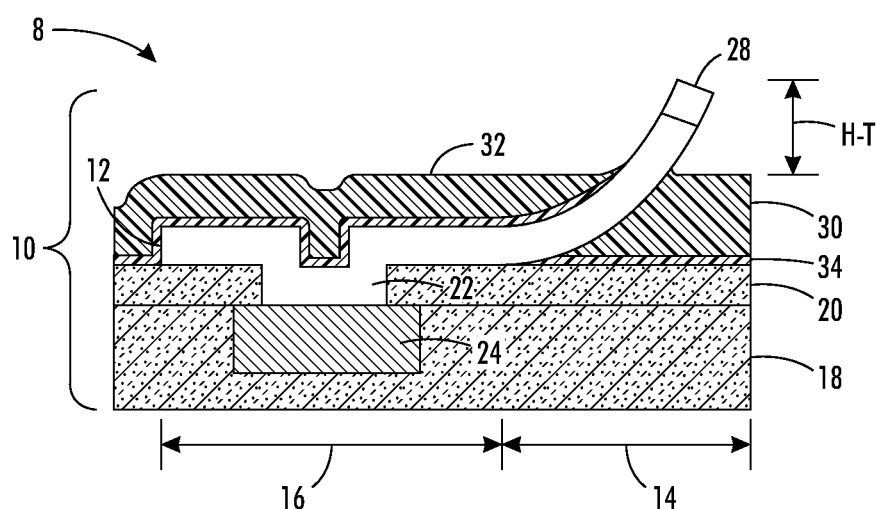
FIG. 4 is a side view of a microspring structure with a laminate structure applied thereover according to one embodiment of the present disclosure.

With reference to FIGS. 3 and 4, once free portion 14 is released, a thin laminate structure 30, is applied over the upper surface of structure 10. Thin laminate structure 30 may be formed of a variety of different materials intended to be permanently applied over structure 10. Silicone is one exemplary material. Silicone is relatively soft and conformal, which is advantageous as will be appreciated from the description below. Another candidate material is known in the trade as Gel-Film, available from Gel-Pak, a division of Delphon Industries, LLC (see, e.g., www.gelpak.com/products/index.cfm?fuseaction=gel-film). For clarity, in this embodiment structure 30 is referred to as a "laminate" structure since in the process of forming the device it is applied, or laminated, over the already-formed microspring and substrate structure. Laminate structure 30 may be comprised of a single material, or may itself be a laminate of several material layers. In certain embodiments, laminate structure 30 may be handled via a carrier sheet (not shown), and transferred off said sheet during application. Laminate structure 30 is of a thickness T. In this embodiment, the laminate thickness T will be less that the height H of microspring 12, although in certain embodiments this may not be the case, at least initially. In other embodiments, such as described below, T may exceed H.

Thin laminate structure 30 is removed from its backing, and applied over the upper surface of structure 10 such that tip 28 of microspring 12 pierces through laminate structure 30. Microspring 12 is undamaged due to the fact that tip 28 is quite small and relatively sharp, and the laminate is relatively soft. Appropriate pressure is applied to the upper surface 32 of structure 30 such that structure 30 generally conforms to the topography of the top surface of structure 10 and is well-seated thereover. An optional adhesive layer 34 on the under surface of laminate structure 30 which contacts the upper surface of structure 10 (e.g., a part of the upper surfaces of microspring 12 and dielectric layer 20) may retain laminate structure 30 in place. In one embodiment it is advantageous to employ a soft, conformal material for structure 30 so that microspring 12 is not damaged in the process of piercing structure 30, and further so that structure 30 can contact a large portion of the non-planar upper surface of structure 10.

Tip 28 of microspring 12 then extends above the upper surface 32 of structure 30 by a distance approximately equal to H−T. Exposed tip 28 can then be used as an electrical contact on a first, or top side of interposer structure 8.

It should be noted here that the amount H−T by which tip 28 extends over the surface 32 of laminate structure 30 is important for controlling the mechanical properties of microspring 12 for use as an electrically conductive pressure contact. If that part of microspring 12 extending over surface 32 is close to perpendicular to the plane of substrate 18 (i.e., at a high angle), microspring 12 may not be sufficiently able to "roll" or smoothly deflect, and thus exhibit little compliance. However, the laminate structure 30 may provide some compliance, depending on the material from which it is formed, the height H−T, the actual angle of tip 28 relative to the contact surface, etc. For example, with laminate structure 30 formed of silicone, and roughly 100 μm thick, and with the amount H−T by which tip 28 extends over the surface 32 in the range of 5-10 μm, more than 10 μm of compliance could be provided.

In certain embodiments it may be desirable to soften structure 30 prior to application, for example to provide a more conformal covering over the surface of structure 10, to further reduce the likelihood of damage to microspring 12 as it pierces structure 30, etc. Softening of structure 30 may be accomplished by heating, by chemical softening, or by other methods as may be known in the art. Furthermore, structure 30 may be comprised of a curable material such as a photocurable epoxy or polymer. Initially, structure 30 is applied is a partly cured state such that it can maintain its physical structure, but is sufficiently soft so as to be conforming, relatively easy for microspring 12 to pierce, etc. Once applied, the curing of structure 30 can be completed, thereby providing a more rigid body in which microspring 12 is embedded. Still further, materials which can be softened after application over structure 10 may be used such that they are more rigid when disposed over structure 10, for example to protect microspring 12, but which can be softened by heat, chemical treatment, etc. to facilitate removal from structure 10 and microspring 12.

At least a part of microspring 12, and specifically a part free portion 14 is disposed "within" laminate structure 30. It is one function of laminate structure 30 to physically support microspring 12. This support can be strength in all directions as the wafer bearing microspring 12 is handled, strength in the direction of deflection when microspring 12 is in spring-contact with a device thereover, and so on. Accordingly, laminate structure 30 should substantially be in contact with the surface of microspring 12, with few gaps therebetween. Laminate structure 30 must have some "give" or tolerance for deflection of microspring 12 while still providing overall added strength to microspring 12.

Laminate structure 30 may also act as a spacer, defining a minimum spacing between the upper surface of substrate 18 (or dielectric layer 20) and the lower surface of a structure (e.g., IC 3 of FIG. 1) contacting tip 28. Still further, laminate structure 30 may provide additional strength to the anchor between microspring 12 and substrate 18, in part due to large surface contact area and adhesion to both, as well as the adhesion provided by adhesive layer 34. Structure 30 further provides a gap stop during spring deflection. While structure 30 does allow some give, a limit is reached at which the material resists further deflection of microspring 12. At this point, the smallest gap between structure 10 and a device in contact therewith is thereby defined. Furthermore, structure 30 additionally provides a moisture and contaminant barrier, protecting a portion of microspring 12, dielectric layer 20, contact 24, etc., from environmental contamination and damage. Still further, the portion of microspring 12 embedded within laminate structure 30 is protected from chemical processing steps such as plating and soldering, that may be required in certain applications of the present disclosure.

Figure 5:
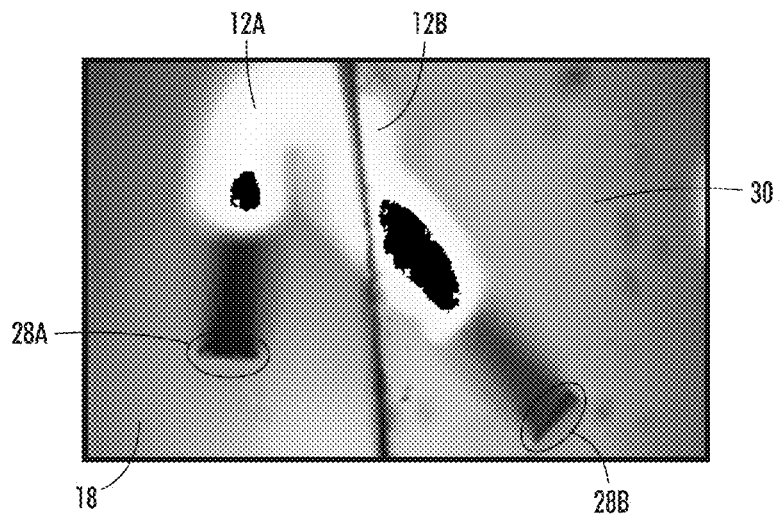
FIG. 5 is a microphotograph of two microsprings, on the left without a laminate structure and on the right embedded within a laminate structure, illustrating that tip heights are approximately equal after embedding in the laminate structure as compared to before embedding in the laminate structure.

FIG. 5 is a microphotograph of two microsprings 12a, 12b with tips 28a, 28b. Microspring 12a is freestanding over substrate 18, while microspring 12b is embedded in a silicone laminate structure 30. The similarity in relative sharpness of the images of tips 28a, 28b confirm that they are approximately equal in height. This confirms that in this embodiment, applying a laminate structure 30 such that tip 28 pierces therethrough results in a tip height of H over the surface on which microspring 12 is formed, and a spacing of tip 28 over a laminate structure of thickness T substantially equal to H−T.

Figure 6:
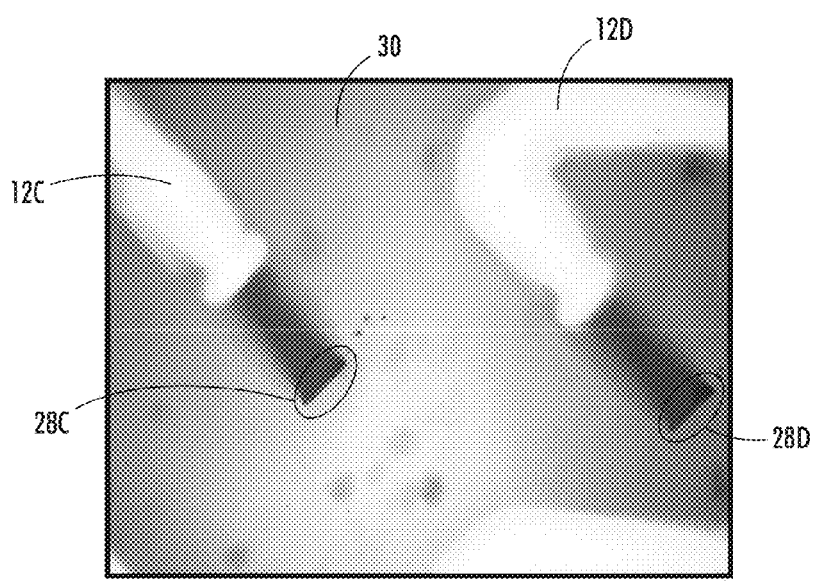
FIG. 6 is a microphotograph of two microsprings, each having been embedded in a laminate structure showing that the two tips protrude through the structure by an approximately equal amount, demonstrating that the process of the present disclosure is applicable to an array of microsprings with substantially uniform results.

Furthermore, FIG. 6 is a microphotograph of two microsprings 12c, 12d, having tips 28c, 28d, respectively, each protruding through a silicone laminate structure 30. The similarity in relative sharpness of the images of tips 28c, 28d confirm that they protrude through silicone laminate structure 30 by an approximately equal amount. Thus, the process of applying laminate structure 30 by way of piercing tips 28 therethrough is applicable to an array of microsprings with substantially uniform results.

Figure 7:
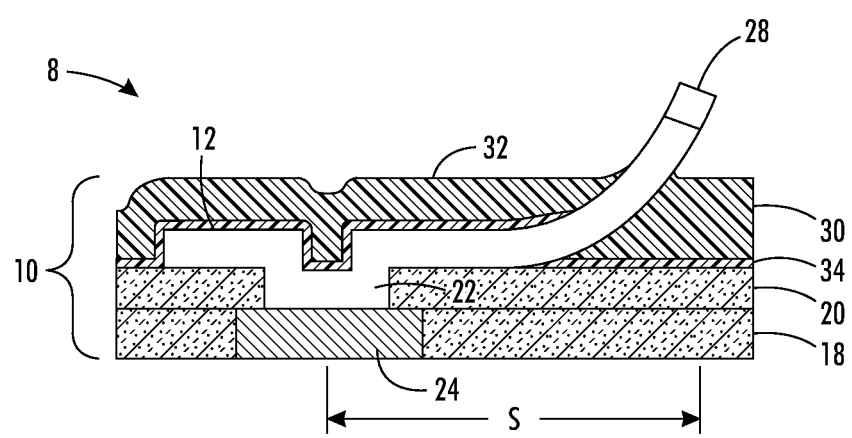
FIG. 7 is a side view of a microspring structure with a laminate structure applied thereover and the substrate processed (e.g., thinned) to expose a portion of an electrical contact to the anchor portion of the microspring according to an embodiment of the present disclosure.

With reference to FIG. 7, the structure is next processed to remove a portion of substrate 18 to thereby expose contact 24 on the back side (opposite the side on which microspring 12 is formed) of substrate 18. An electrical connection is established between tip 28 and exposed contact 24 through substrate 18. In this way, a functioning interposer is provided. Each of substrate 18 and laminate structure 30 are individually dielectric bodies. Together they also form a dielectric body within which a portion of microspring 12 is embedded. The spacing, S, between tip 28 and contact 24 is designed to properly accommodate the change in contact pad pitch from one device above interposer 8 (for example IC 3, FIG. 1), to another device below interposer 8 (for example PCB 4, FIG. 1). (Distance S is also illustrated in FIG. 1 in the context of interposer 2 located between two devices 3, 4.)

It will be understood that while the above-described process begins with a substrate having a via formed therein and filled with conductive material before formation of microspring 12, the process may be reversed. That is, microspring 12 may be formed over substrate 18, and thereafter via 26 and contact 24 formed. This process may eliminate the need to thin substrate 18.

Figure 8:
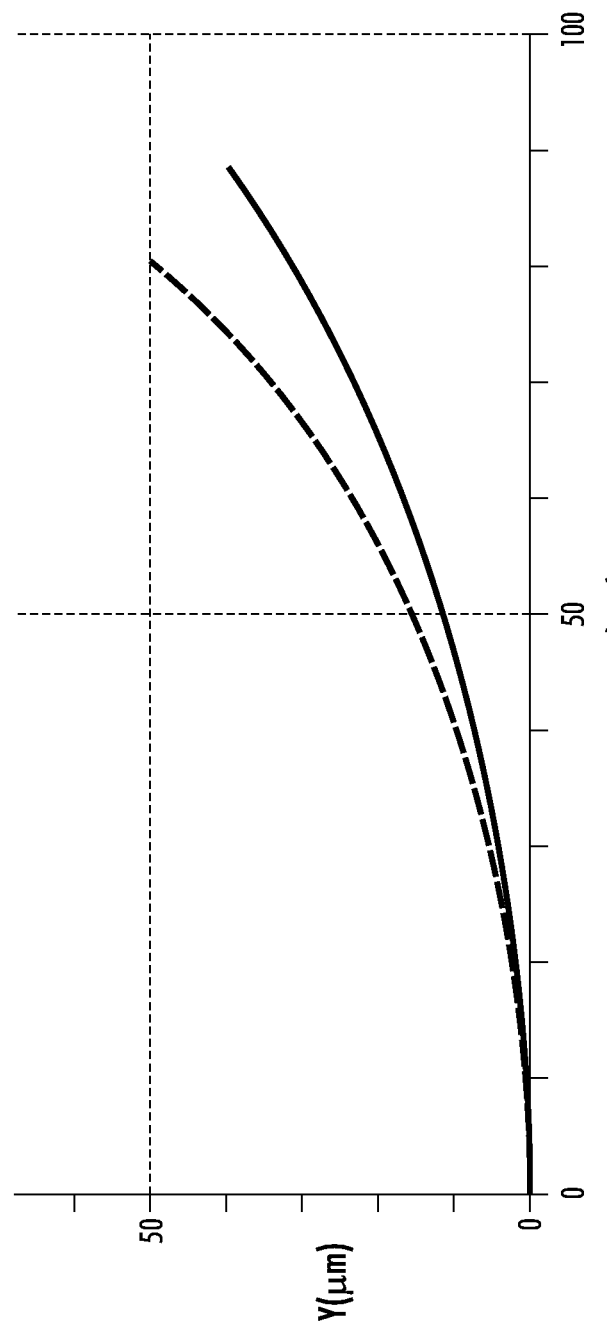
FIG. 8 is a graph of orthogonal displacements of a tip of a microspring in an undeflected and deflected state illustrating the extent of lateral tip deflection to accommodate differences in tip position in as-formed arrays of microsprings according to the present disclosure.
Figure 9A:
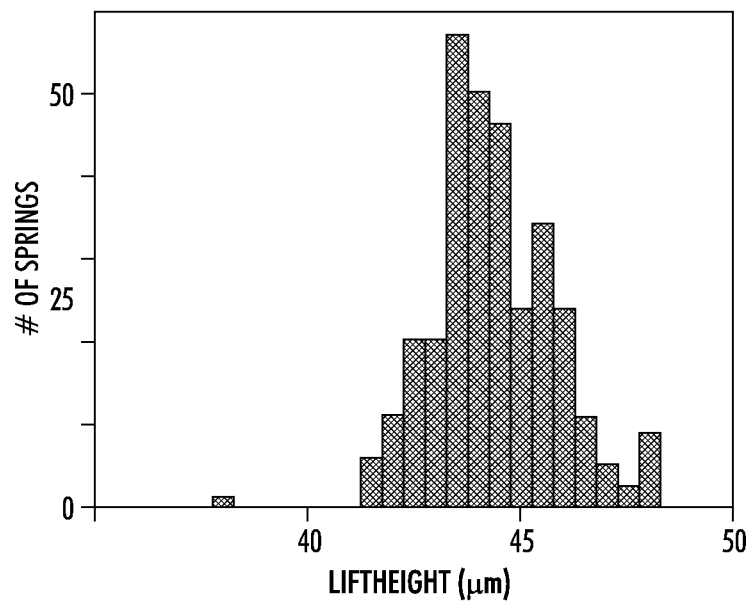
FIGS. 9A and 9B are graphs of lift-height deviation across a single die and across multiple die formed on a single, respectively, according to the present disclosure.
Figure 9B:
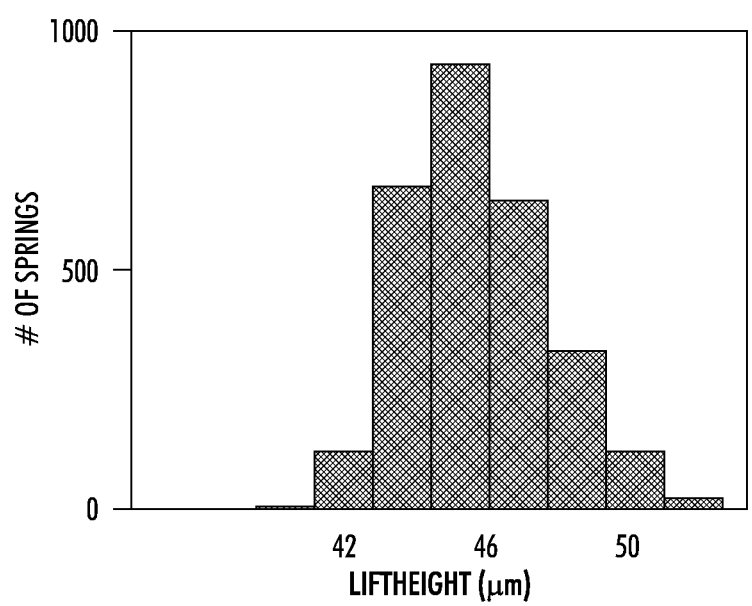

The X-Y placement accuracy of tip 28 is important for package assembly alignment. One benefit of the present disclosure is that vertical displacement of tip 28 also results in horizontal displacement. Modeling indicates that X-Y position of the spring tips deviating from specification by as much as 5 μm may be accommodated by the lift-height (H) of the microsprings. For example, with reference to FIG. 8, which is a profile of a microspring with an undeflected lift-height at 50 μm and a deflected light-height at 40 μm, it can be seen that a 10 μm deflection of the tip in the Y-direction produces an approximately 8 μm deflection of the tip in the X-direction. Providing an array of microsprings with a lift-height deviation of less than 10 μm is illustrated across a single die in FIG. 9A, and across multiple die formed on a single 100 mm diameter wafer in FIG. 9B (noting that the measurement error is +/−5 μm, implying that the spread in lift-height may actually be narrower than shown).

Figure 10:
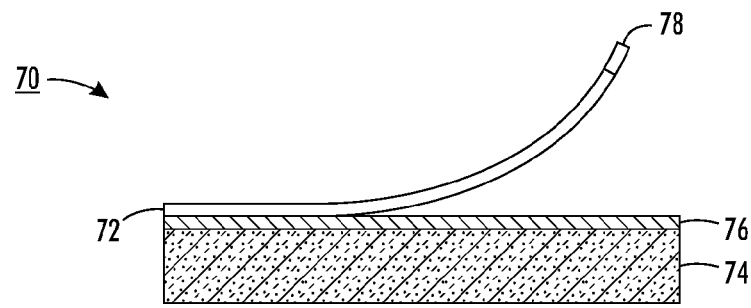
FIG. 10 is a side view of a microspring structure comprising a microspring formed over a dielectric layer carried by a substrate of a type that may form another embodiment of the present disclosure.
Figure 11:
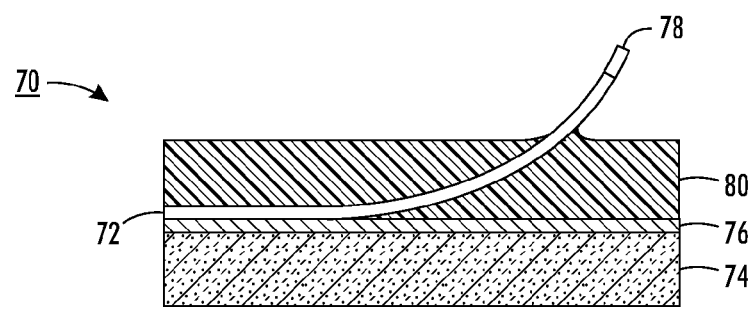
FIG. 11 is a side view of a microspring structure with a thin laminate structure applied thereover according to one embodiment of the present disclosure.
Figure 12:
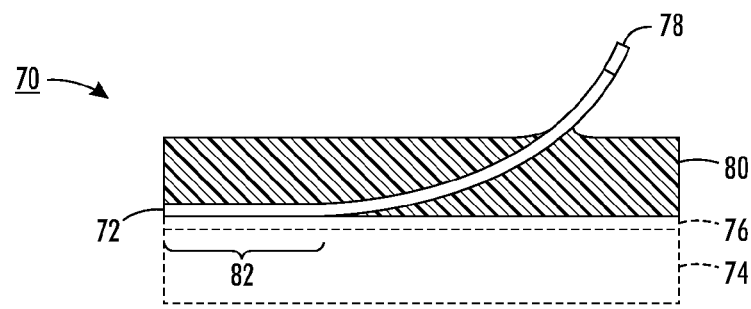
FIG. 12 is a side view of a microspring structure with a laminate structure applied thereover and the substrate removed to expose a part of the anchor portion of the microspring according to one embodiment of the present disclosure.

FIG. 10 is an illustration of another embodiment of a microspring structure providing both top and bottom surface contact according to the present disclosure. Forming microspring 72 over substrate 74 forms interposer 70. Optionally, a sacrificial layer 76 may be disposed between microspring 72 and substrate 74. As described, a free portion of microspring 72 is released from the plane in which it was formed, such as by engineered internal stress, such that a tip 78 is elevated above the upper surface of substrate 74. With reference to FIG. 11, a laminate structure 80 is then applied or deposited over microspring 72 and substrate 74, such that tip 78 protrudes above the surface of laminate structure 80, for example as described above. With reference to FIG. 12, substrate 74 is then removed, for example by way of sacrificial layer 76 or by other method known in the art, to expose anchor portion 82 of microspring 72. If microspring 72 is formed of electrically conductive material, or coated in electrically conductive material, an electrical connection is established between tip 78 and exposed anchor portion 82 of microspring 72, in this embodiment without the need to form a via through substrate 74.

In the embodiment shown in FIGS. 10 through 12, there is a desire to provide structural rigidity to the array of microsprings in the absence of substrate 74. For this reason, and potentially others, laminate structure 80 may be formed of rigid material (e.g., polyimide) as opposed to the more flexible aforementioned silicone.

It will be understood that in a variation of the above-described embodiments, and referring to FIG. 2, via 22 may be formed in dielectric layer 20, but no contact 24 or via 26 are formed. Rather, following processing, substrate 18 is removed completely, as described with reference to FIG. 12, exposing a portion of microspring 12 extending into opening 22 for contact at the back-side of interposer 8. Structural rigidity may be provided by laminate structure 30 (FIG. 4), in a fashion similar to that described in reference to FIGS. 10 through 12.

In accordance with another embodiment disclosed herein, a laminate structure may be placed over the microspring structure and completely cover the microspring so that the wafer may be handled, processed, etc., with the spring tips protected. At a point in time following the handling, further processing, etc., the laminate structure may be removed in whole or in part to expose the microspring or a portion thereof. The following illustrates these concepts in more detail.

Figure 13:
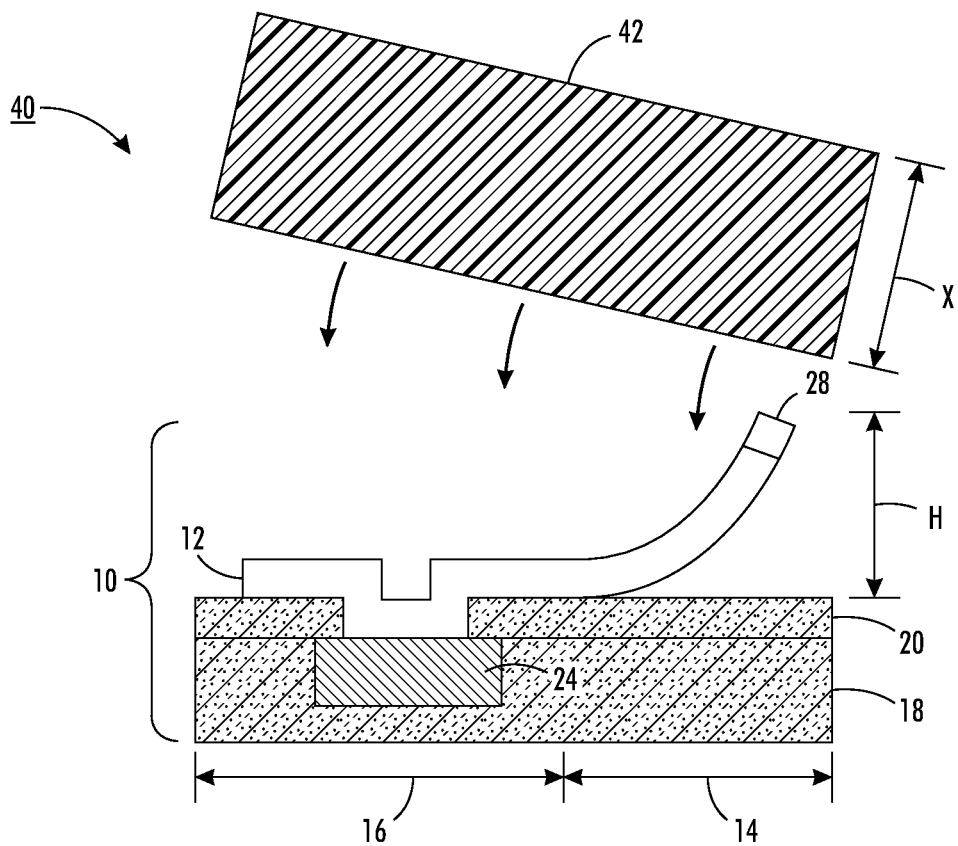
FIG. 13 is a side view of a microspring structure with a thick laminate structure in the process of being applied thereover according to one embodiment of the present disclosure.

With reference to FIG. 13, there is shown therein a first step in the covering of a microspring 12 with a thick protection laminate structure 42. As described previously, once free portion 14 is released, a protection laminate structure 42 is applied over the upper surface of structure 10. Microspring 12 extends upward from the surface of dielectric layer 20 to a height H. In this embodiment, protection laminate structure 42 is of a thickness X, where X>H, so that microspring 12 is fully embedded therein when applied.

Protection laminate structure 42 may be fabricated of a variety of materials, but should be relatively soft in order to permit tips 28 to pierce the surface of protection laminate structure 42 and thereby embed a portion of microspring 12 therein without damaging microspring 12. The material from which protection laminate structure 42 is formed should also be strong enough and rigid enough that, once a portion of microspring 12 is embedded therein, structure 42 provides physical and environmental protection for microspring 12. Again, silicone is one example of a material that may meet these somewhat conflicting requirements.

Figure 14:
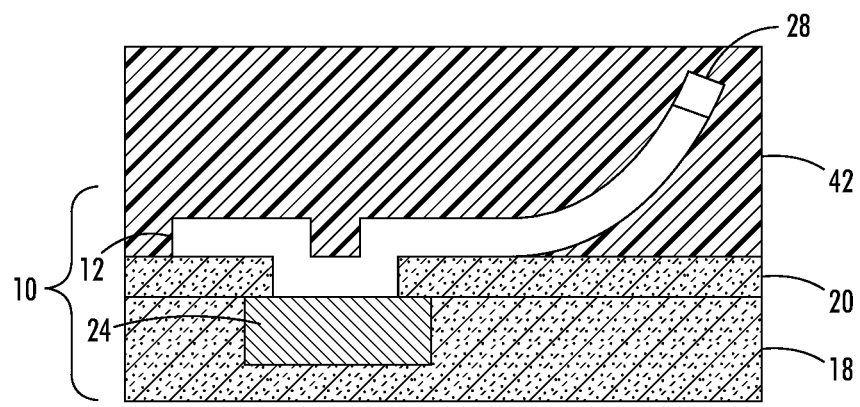
FIG. 14 is a side view of a microspring structure with a thick laminate structure applied thereover according to one embodiment of the present disclosure in which the microspring is fully embedded within the laminate structure.

With reference to FIG. 14, structure 10 is shown with protection laminate structure 42 in place thereover. The entirety of microspring 12 is embedded within protection laminate structure 42. The structure may now be handled with a reduced risk of damaging microspring 12. For example, working from the backside, substrate 18 may now be thinned, for example by grinding, chemical etching, etc., or even fully removed, while microspring 12 is protected within protection laminate structure 42.

Figure 15:
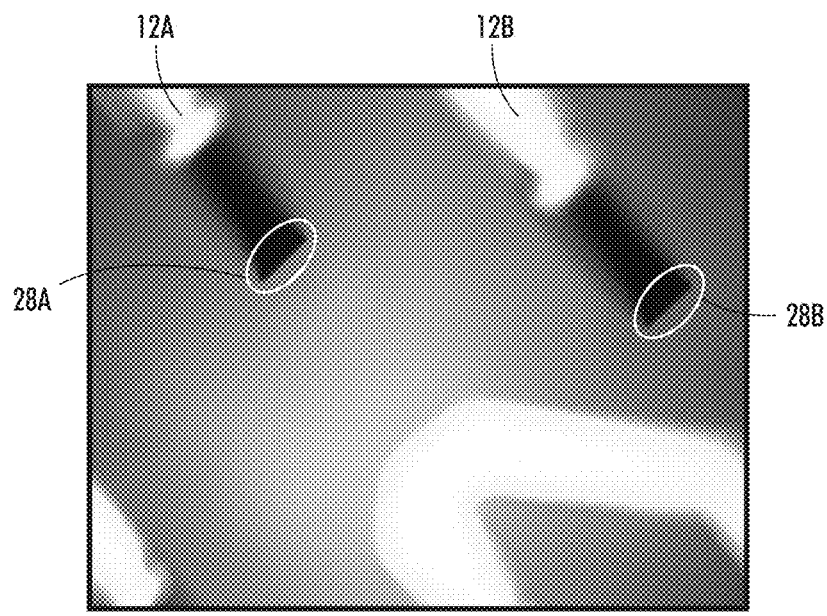
FIG. 15 is a microphotograph of two microsprings after the steps of applying a laminate structure, then removing that laminate structure showing, by way of the similarity in relative sharpness of the images of the two tips that they are approximately equal in height, and that the removal of the silicone laminate structure did not noticeably damage the microsprings.

The application of a laminate structure may be reversible, in that it may be removed without damaging microspring 12. For example, by properly selecting the material (e.g., silicone) for protection laminate structure 42, that structure can be removed after any post-formation handling and processing, leaving microspring 12 exposed for contact. In addition, heat and/or optical release techniques may be used to control the relative adhesion of protective laminate structure 42 facilitating its release from structure 10. Protection while processing the substrate, such as thinning (e.g., FIG. 7) or completely removing (e.g., FIG. 12) the substrate can thereby be provided. FIG. 15 is a microphotograph of two springs 12a, 12b, having tips 28a, 28b, respectively, after the steps of applying a silicone laminate structure (not shown), then removing that laminate structure. The similarity in relative sharpness of the images of tips 28a, 28b confirm that they are approximately equal in height. This confirms that in this embodiment the removal of the silicone laminate structure did not noticeably damage the microsprings or change their relative lift-heights (the height at which the microspring tip self-rises from the plane in which it was formed).

Microspring 12 may remain fully embedded in laminate structure 42 during post-formation handling and processing. Thereafter, a portion of laminate structure 42 may be etched or otherwise selectively removed to expose a portion proximate tip 28 for contact, leaving the remainder of laminate layer 42 in place over anchor portion 16.

Figure 16:
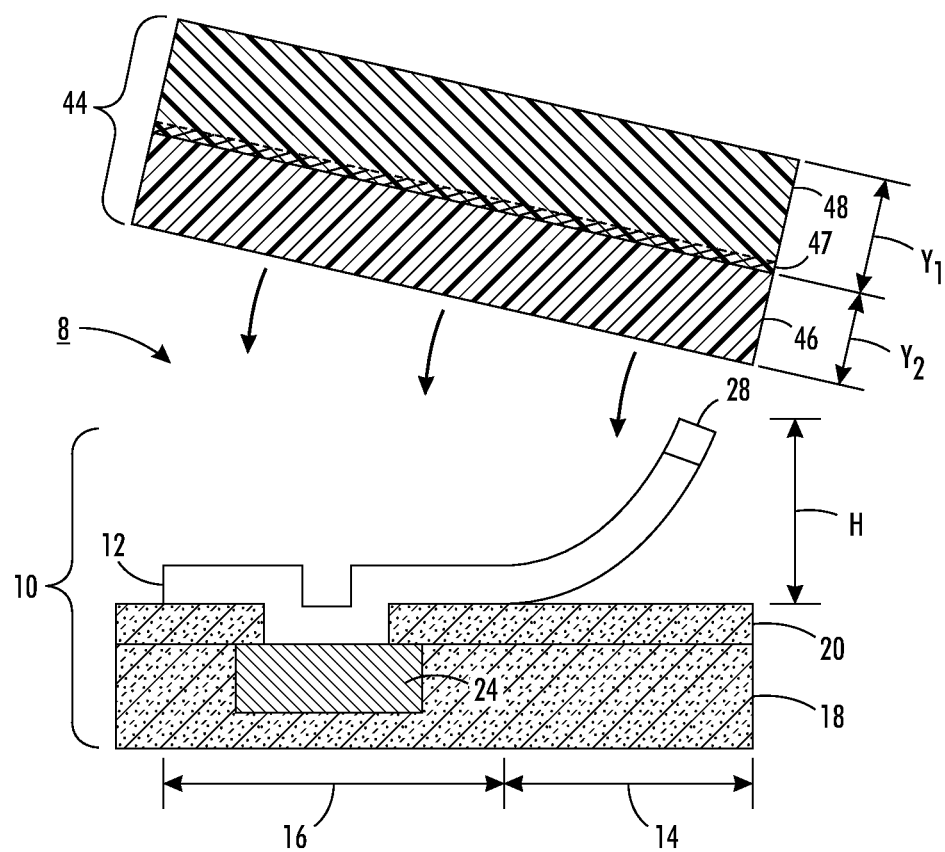
FIG. 16 is a side view of a microspring structure with a thick multi-layered laminate structure in the process of being applied thereover according to one embodiment of the present disclosure.

In accordance with yet another embodiment of the present disclosure, the protective laminate structure having a thickness such that the microspring is fully embedded therein may be comprised of at least two layers. One of the layers is intended to remain attached to the microspring structure, while another one of the layers is intended to be removed following handing, further processing, etc. during which the protective laminate structure protects the microspring. FIG. 16 is an example of such an embodiment. As described previously, once free portion 14 is released, a relatively thick protection laminate structure 44 is applied over the upper surface of structure 10. Protection laminate structure 44 shown in FIG. 16 is comprised of two layers—interposer substrate layer 46 and handle layer 48. In other embodiments additional layers may be employed. The layers may each be comprised of the same material, or may be comprised of different materials, depending on the application of the present disclosure.

Microspring 12 extends upward from the surface of dielectric layer 20 to a height H. The thickness of protection laminate structure 44 is the sum of the thicknesses $Y_1$ and $Y_2$ of layers 46, 48, respectively. The overall thickness of structure 44 will be such that microspring 12 is fully embedded therein, i.e., $Y_1+Y_2>H$. Layers 46, 48 may be fabricated of a variety of materials, taking into consideration the piercing by tip 28 and the level of desired protection discussed above.

In one embodiment, each of layers 46, 48 are silicone and are separately formed so that there is a surface energy boundary between the two layers that facilitates their separation after application to structure 10 and any required handling and processing. In another embodiment, a release layer 47 is disposed between layers 46, 48, which is sufficiently adhesive that layers 46, 48 stick together when applied, but also assists with their subsequent separation. In still another embodiment, a heat-activated or photo-activated layer (not shown) initially adheres layers 46, 48 together, but with the application of heat or light the layer facilitates separation of layers 46, 48 when needed.

Figure 17:
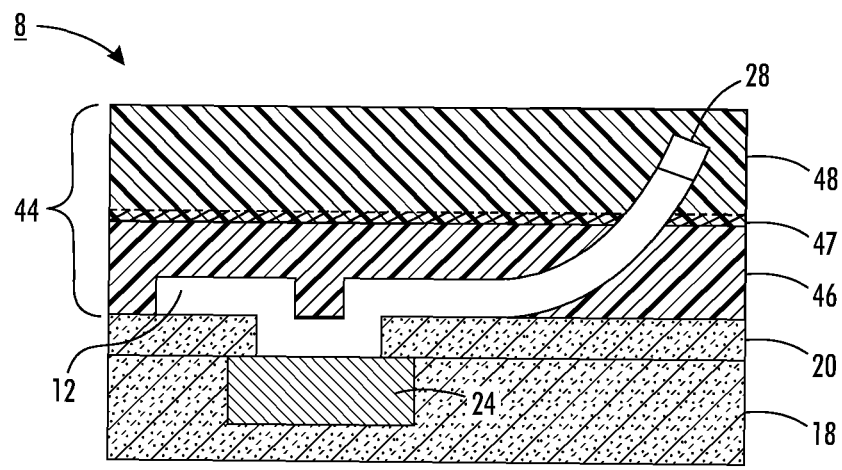
FIG. 17 is a side view of a microspring structure with a thick multi-layered laminate structure applied thereover according to one embodiment of the present disclosure in which the microspring is fully embedded within the laminate structure.
Figure 18:
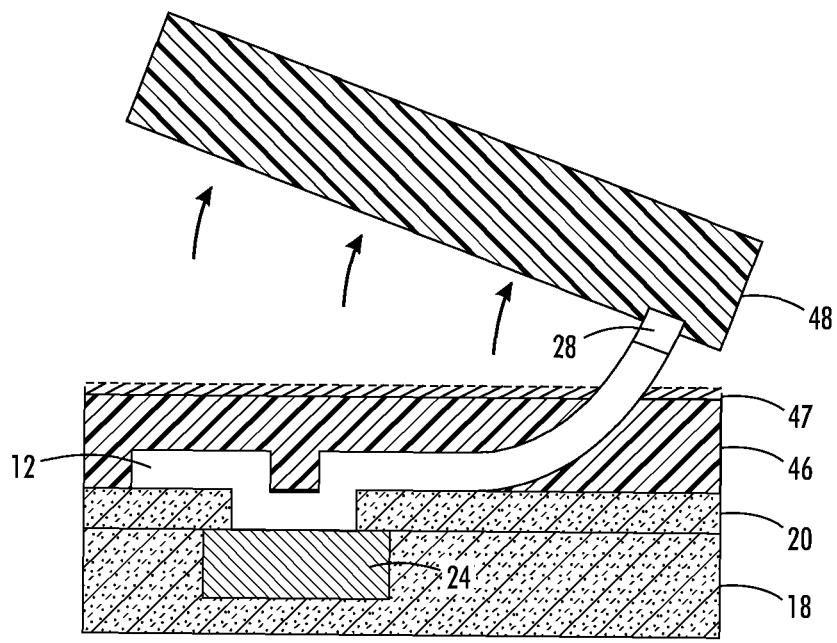
FIG. 18 is a side view of the microspring structure of FIG. 17 following the removal of one layer of the thick multi-layered laminate structure in which the tip portion of the microspring is exposed for contact according to one embodiment of the present disclosure.

With reference to FIG. 17, interposer structure 8 is shown with protection laminate structure 44 in place. The entirety of microspring 12 is embedded within protection laminate structure 44. The structure may now be handled with a reduced risk of damaging microspring 12. For example, working from the backside, substrate 18 may now be thinned, for example by grinding, chemical etching, etc., while microspring 12 is protected within protection laminate structure 44. Following any handing and processing, handle layer 48 may then be removed from the structure, as illustrated in FIG. 18, for example using heat or light to assist with the separation of layers 46, 48. By properly selecting the material for interposer substrate layer 46 and handle layer 48, handle layer 48 can be removed after any post-formation handling and processing, leaving part of microspring 12 embedded in interposer substrate layer 46, and the remainder of microspring 12 exposed for contact.

Figure 19:
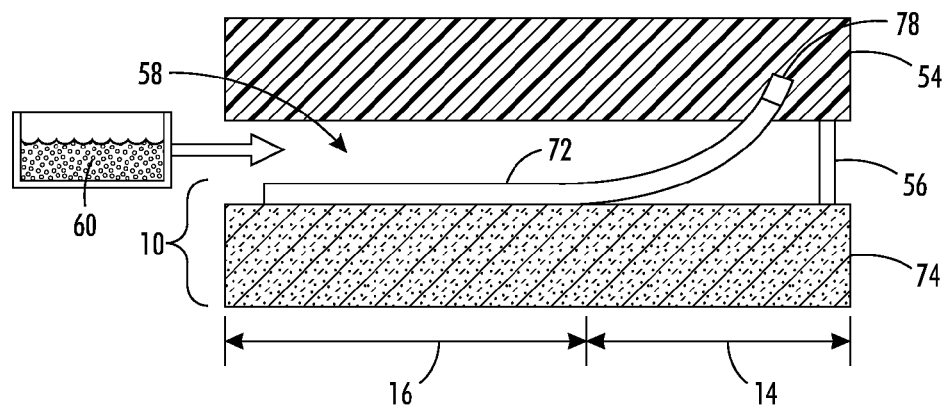
FIG. 19 is a side view of a microspring structure having a mold structure disposed thereover forming a cavity, and in which the tip portion of the microspring is embedded, such that a laminate structure material can be introduced into the cavity according to one embodiment of the present disclosure.

In accordance with still another embodiment of the present disclosure, an injection cavity may be formed over a microspring structure, and an appropriate material injected into the cavity to surround a part of the microspring. The injection cavity may be formed between the upper surface of the dielectric layer on which the microspring is formed and a mold structure of material into which the microspring tip may be embedded, which is spaced apart from the dielectric surface. This embodiment is illustrated in FIG. 19. Once free potion 14 is released, a mold structure 54 is disposed over substrate 74, such as by resting upon a spacer 56 or other appropriate method. A cavity 58 is thereby formed between substrate 74 and mold structure 54. An appropriate material, such as a curable polymer, is then injected into cavity 58 in liquid form. As a portion of microspring 72 is embedded in mold structure 54, that portion of microspring 72 is masked from being embedded in the injected material. The injected material is then cured, and mold structure 54 is thereafter removed.

Figure 20:
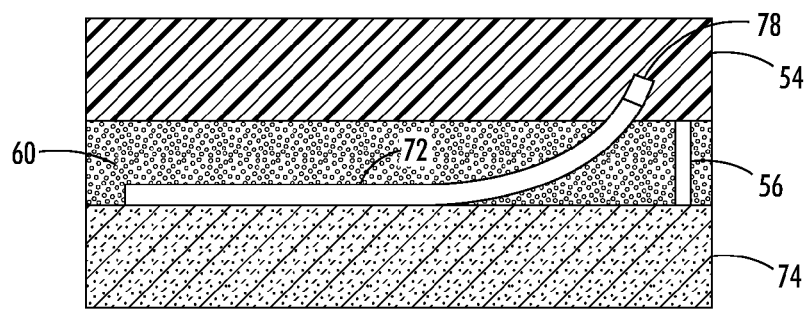
FIG. 20 is a side view of the microspring structure of FIG. 19 following introduction of material into the cavity and curing of the material, according to one embodiment of the present disclosure.
Figure 21:
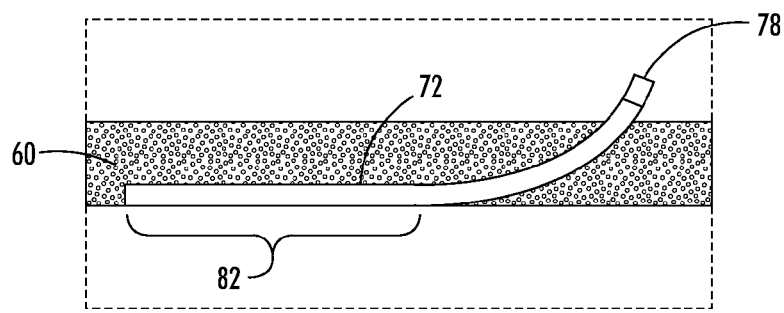
FIG. 21 is a side view of the microspring structure of FIGS. 19 and 20 following removal of the mold structure, according to one embodiment of the present disclosure.

The fully embedded microspring structure is shown in FIG. 20, and the finished structure is shown in FIG. 21, in which a portion of microspring 72 is embedded in cured polymer 60, the tip portion 78 is exposed for contact above cured polymer 60, the anchor portion 82 is exposed for contact below cured polymer 60, and the central portion of microspring 72 is embedded within polymer 60. Curable polymer is just one example of the materials that may be employed in this embodiment for embedding a portion of microspring 12. Furthermore, it is possible to leverage existing flip-ship packaging processes and apparatus, reducing the need to develop special fixtures, processes, materials and the like to support this aspect of the disclosure. Finally, this embodiment may apply equally to microspring embodiments that employ substrate vias, such as illustrated in FIG. 1.

According to a variation of the above embodiment, a liquid laminate material may be applied over and encase microspring 72 without use of a mold structure 54. Rather, the liquid laminate may simply be applied either relying on its viscosity or on lateral walls (not shown) to control the flow and ultimately the thickness of the laminate material. Once applied, the liquid laminate material can be cured or otherwise hardened in-place. Uniformity of the laminate layer is provided by the flow of the liquid to level. This approach is gentle on the springs and permit a wide variety of spring designs. Microspring 72 may be fully embedded in the laminate layer so applied, or merely partly embedded leaving a portion proximate tip 78 exposed for contact. In the event that the microspring 72 is initially fully embedded in the laminate layer, a portion of the laminate layer may be etched, or otherwise removed as described herein to expose a portion proximate tip 78 exposed for contact.

Figure 22:
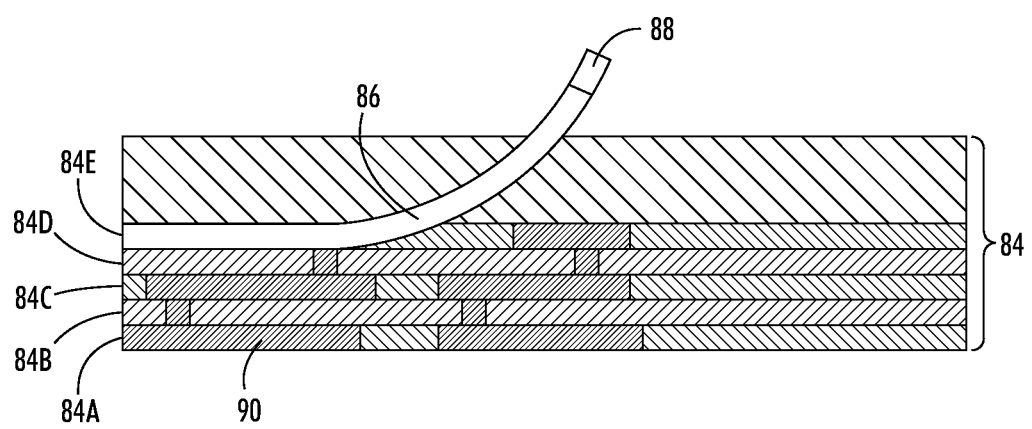
FIG. 22 is a side view of a multiple-layer interposer with through-substrate connection being made by multi-layer rerouting according to an embodiment of the present disclosure.

While described above as being formed essentially as a single-layered device before application of the laminate structure, it is possible to form the microspring as part of a multiple-layer substrate with through-substrate connection being made by multi-layer rerouting, vias, or other techniques. For example, with reference to FIG. 22, a multiple-layer interposer 84 is shown. The various layers, such as 84a, 84b, 84c, 84d, 84e, and so on may be formed before or after depositing the stress-engineered layer to form microspring 86. Each layer may be pattered, etched, and deposited such that a series of conductive lines and filled vias connect a tip portion 88 of microspring 86 to a backside contact 90. For example, traditional polyimide buildup with etching, metal deposition, and patterning can provide routing often required for complex chips. Metallization to aid interconnects such as gold stud bumping or solder connections can be included.

Figure 23:
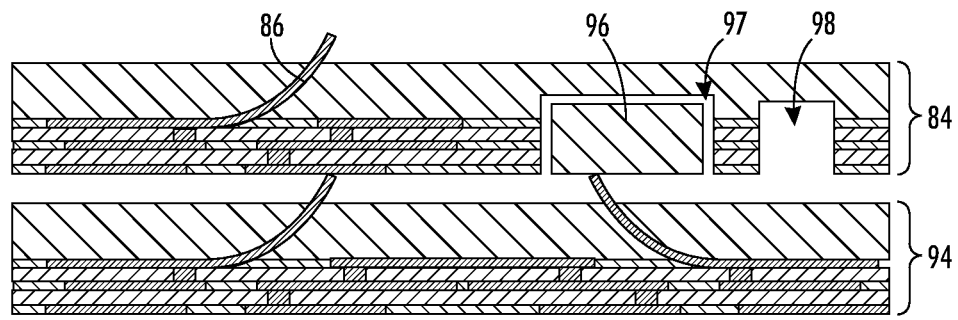
FIG. 23 is a side view of a multiple-layer interposer with through-substrate connection being made by multi-layer rerouting and further including vias to accommodate intermediate device connections, cooling materials, environmental seals, etc., according to an embodiment of the present disclosure.

The multilayer interposer 84 can be also patterned at virtually any point during device fabrication. For example, cavities can be formed in one or both sides of the interposer for a variety of purposes. Several such cavities are illustrated is FIG. 23, which shows interposer 84 mounted over a secondary device 94. While secondary device 94 is shown itself as a multi-layer interposer, suggesting that for certain applications interposers disclosed herein can be stacked, the present disclosure is equally applicable where secondary device 94 is a single-layer device, such as a standard printed circuit board or the like. One function served by such cavities, such as cavity 97, is to provide a space for active or passive intermediate components such as IC chip 96. Another function, such as may be served by cavity 98, is to provide a pathway for thermal fluids to provide cooling, a region to accept a sealing gasket material to provide environmental protection to the interior connections, etc. Coolant can also be flowed, sealant applied, etc., between the layers around the springs (active side cooling).

Figure 24:
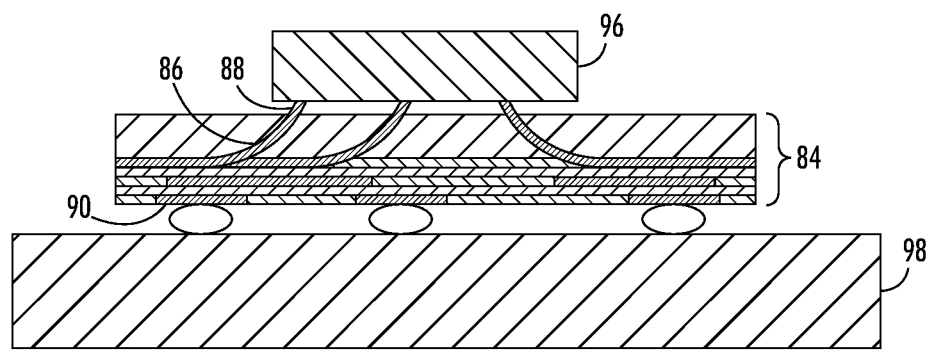
FIG. 24 is a side view of a multiple-layer interposer with a first electronic structure (shown below the interposer) and a second electronic structure (shown above the interposer) electronically interconnected by microsprings according to one embodiment of the present disclosure.

With reference to FIG. 24, as previously described with reference to a single-layer interposer design (e.g., FIG. 1), the role of multi-layer interposer 84 is to electrically connect contact pads on IC 96 to contact pads on PCB 98. The connection is made by microsprings 86 which extend through interposer 84, and connect with backside contacts 90, in this embodiment by way of multi-layer re-routing.

Figure 25:
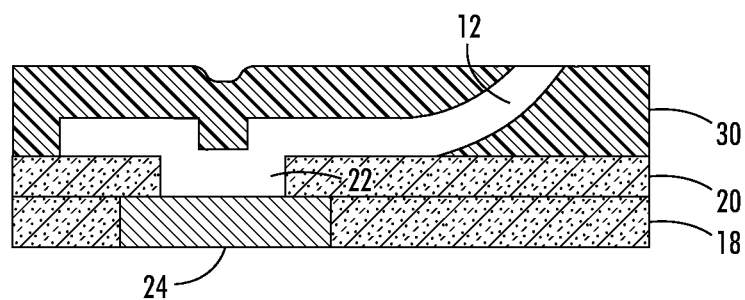
FIG. 25 is a side view of a microspring structure comprising a microspring formed over a dielectric layer carried by a substrate with the microspring formed to be coplanar with the top surface of a laminate layer of a type that may form another embodiment of the present disclosure.

While in the above discussion the tip of the microspring has been assumed to protrude above the top surface of the substrate or laminate structure, one variation contemplated by the present disclosure is to make the tip of the microspring flush with the top surface of the substrate or laminate structure, such as by etching, polishing, precise laminate thickness control, and so on. An example of such an embodiment is illustrated in FIG. 25. Embodiments may then be accommodated where such a resulting surface contact are required.

Likewise, it is contemplated that the tip of the microspring may be plated or provided with solder or other conductive interconnect material. In such a case, the laminate structure may act as a plating or solder mask, as more fully described in the aforementioned U.S. patent application Ser. No. 12/887,775.

Figure 26:
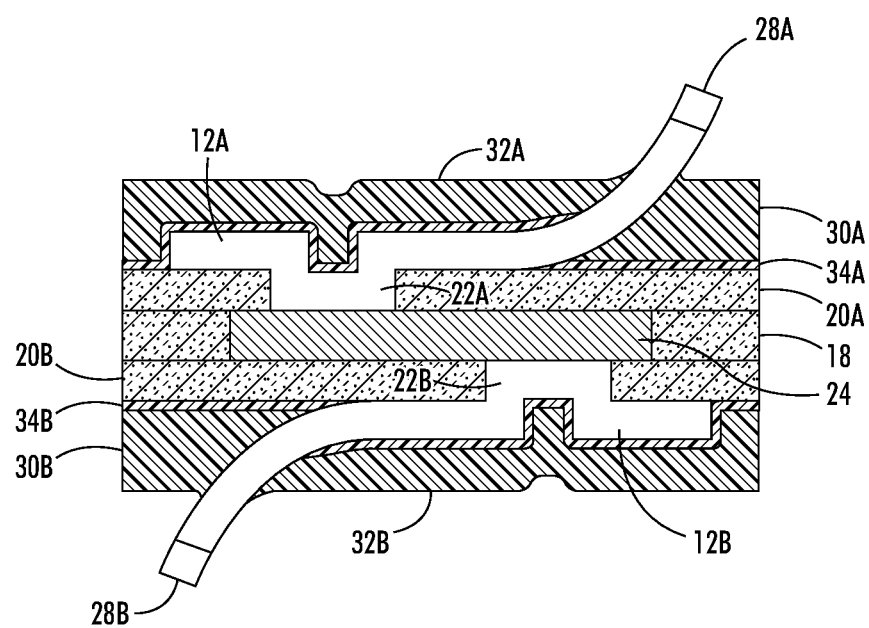
FIG. 26 is a side view of a structure comprising two microsprings, each formed on opposite sides of a substrate, of a type that may form still another embodiment of the present disclosure.
Figure 27:
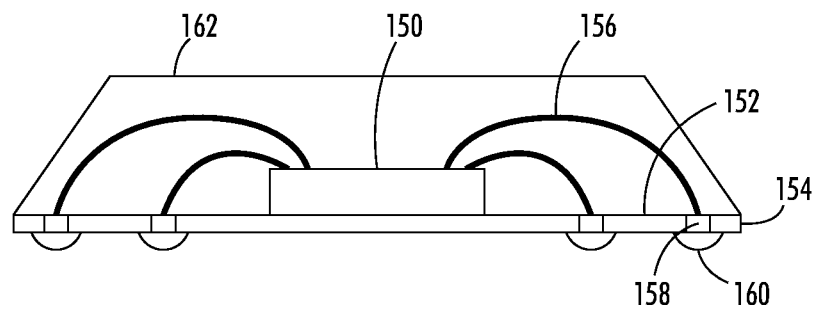
FIG. 27 is a cut-away side view of an interposer of a type known in the art.

While the embodiments discussed above have focused on microsprings formed on a single surface of the substrate, it is within the scope of the present disclosure that microspring contacts may be formed on two opposite sides of a substrate, as illustrated in FIG. 26. With microsprings extending in opposing directions as illustrated, temporary connections to devices at the front and back sides of substrate 18 are facilitated. One application of such an embodiment is an interposer for integrated testing and packaging. The embodiment of FIG. 26 may be produced by forming a microspring 12A on a first side of substrate 18, protecting the microspring with a thick laminate layer as described above, inverting the device, and forming microspring 12B. Alternatively, microspring 12A may be formed on a first substrate 18, microspring 12B may be formed on a second substrate (not shown), and either the first and second substrates joined back-to-back, or the second substrate may be removed, as described above, and the remaining structure joined to the first substrate.

It should be understood that when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. An interposer structure, comprising:
    a dielectric body having a first surface and a second surface, said first and second surfaces being roughly parallel and on opposite sides of said dielectric body;
    a via formed in said dielectric body between and communicatively coupling said first and said second surfaces;
    electrically conductive material disposed within said via to thereby electrically connect regions on said first and second surfaces;
    a microspring formed at least in part over said dielectric body comprising an anchor portion and a free portion in physical and electrical communication with one another;
    said free portion having a non-planar profile, in the absence of an external force applied thereto, said free portion being free to move relative to said first surface of said dielectric body;
    said anchor portion being fixed to said dielectric body and disposed for electrical connection thereto at said second surface; and
    at least a portion of said microspring between said anchor portion and said free portion being disposed within said dielectric body and in electrical communication with said electrically conductive material disposed within said via so as to provide electrical communication between said region on said first surface and said microspring disposed at said second surface.

2. The interposer of claim 1, further comprising a substantially homogeneous laminate structure applied over a substrate and at least in part surrounding said microspring.

3. The interposer of claim 1, wherein said at least a port of said free portion has a region of solder applied thereto.

4. The interposer of claim 2, wherein said substrate on which said microspring is formed is completely removed from said interposer.

5. The interposer of claim 4, wherein said substantially homogeneous laminate structure is comprised at least in part of silicone.

6. An interposer for connecting a first electronic structure having bonding pads disposed at a first pitch on a first surface thereof to a second electronic structure having bonding pads disposed at a second pitch on a first surface thereof, said first and second electronic structures and said interposer disposed in a stacked arrangement, comprising:
 said interposer disposed over said first electronic structure, said interposer comprising:
  a dielectric body having a first surface and a second surface, a plurality of conductive vias electrically connecting regions of said first surface and regions of said second surface, a plurality of microsprings formed on said dielectric body, each microspring comprising:
   an anchor portion and a free portion in physical and electrical communication with one another;
   said free portion having a non-planar profile, in the absence of an external force applied thereto, said free portion being free to move relative to said first surface of said dielectric body;
   said anchor portion being fixed to said dielectric body and disposed for electrical connection at a respective electrically conductive via at said second surface of said dielectric body; and
  at least a portion of each said microspring between said anchor portion of said microspring and said free portion of said microspring being disposed within said dielectric body;
 said conductive vias providing, by way of said regions of said second surface of said dielectric body, electrical interconnection between said bonding pads of said first electronic structure and said anchor portions of said microsprings;
 said second electronic structure disposed over said first surface of said dielectric body such that said bonding pads of said second electronic structure are physically and electronically connected to said free portions of said microsprings; and
 whereby selected ones of said bonding pads of said first electronic structure are uniquely electronically connected to selected ones of said bonding pads of said second electronic structure by way of said microsprings.

* * * * *